(12) United States Patent
Choi et al.

(10) Patent No.: US 8,330,353 B2
(45) Date of Patent: Dec. 11, 2012

(54) ORGANIC LIGHT EMITTING DEVICE AND MANUFACTURING METHOD THEREOF

(75) Inventors: Jun-Ho Choi, Yongin (KR); Sung-Soo Lee, Suwon (KR); Chang-Mo Park, Seoul (KR); Seong-Min Kim, Anyang (KR)

(73) Assignee: Samsung Display Co., Ltd., Yongin (KR)

( * ) Notice: Subject to any disclaimer, the term of this patent is extended or adjusted under 35 U.S.C. 154(b) by 203 days.

(21) Appl. No.: 12/326,555

(22) Filed: Dec. 2, 2008

(65) Prior Publication Data
US 2009/0251048 A1 Oct. 8, 2009

(30) Foreign Application Priority Data
Apr. 2, 2008 (KR) .................. 10-2008-0030614

(51) Int. Cl.
*H01J 1/62* (2006.01)

(52) U.S. Cl. ..................................................... 313/504
(58) Field of Classification Search ........... 313/498–506
See application file for complete search history.

(56) References Cited

U.S. PATENT DOCUMENTS
2005/0269942 A1* 12/2005 Ahn et al. .................... 313/503

* cited by examiner

*Primary Examiner* — Anh Mai
*Assistant Examiner* — Brenitra M Lee
(74) *Attorney, Agent, or Firm* — H.C. Park & Associates, PLC

(57) ABSTRACT

The present invention relates to an organic light emitting device including a substrate, an insulating layer disposed on the substrate, a first electrode disposed on the insulating layer, an organic light emitting member disposed on the first electrode, and a second electrode disposed on the organic light emitting member. The insulating layer includes a furrow corresponding to at least one edge of the first electrode, and at least a portion of the second electrode is disposed in the furrow.

13 Claims, 6 Drawing Sheets

| | | Group | | |
|---|---|---|---|---|
| B | W | B | W | B |
| G | R | G | R | G |
| B | W | B | W | B |
| G | R | G | R | G |
| B | W | B | W | B |

ORGANIC LIGHT EMITTING DEVICE AND MANUFACTURING METHOD THEREOF

CROSS-REFERENCE TO RELATED APPLICATION

This application claims priority from and the benefit of Korean Patent Application No. 10-2008-0030614, filed on Apr. 2, 2008, which is hereby incorporated by reference for all purposes as if fully set forth herein.

BACKGROUND OF THE INVENTION

1. Field of the Invention

The present invention relates to an organic light emitting device and a manufacturing method thereof.

2. Discussion of the Background

In general, in an active type of flat panel display, a plurality of pixels are arranged in a matrix form, and images are displayed by controlling the luminance of each pixel according to given display information One such active matrix flat panel display device is an organic light emitting display, which is a self-emissive display device having low power consumption, a wide viewing angle, and a high response speed. Therefore, the organic light emitting display is being spotlighted as a next-generation display device to surpass the liquid crystal display (LCD).

The organic light emitting device includes an organic light emitting element, that is, two electrodes with an emission layer disposed therebetween. Electrons injected from one of the electrodes and holes injected from the other electrode are combined in the light emitting layer to form excitons, and the excitons release energy and cause light to be emitted.

The organic light emitting device also includes a driving transistor to drive the organic light emitting element and a switching transistor to apply data voltages to the driving transistor, and the transistors are the thin film transistor (TFT) type.

Light emitted from the emission layer of the organic light emitting device passes through various layers having different refractive indexes. However, when the light is totally reflected or is dissipated to the side, the light is not used to display the images and thus light efficiency may be decreased. To increase the light efficiency of the organic light emitting device, loss of the light emitted from the emission layer should be prevented.

SUMMARY OF THE INVENTION

The present invention provides an organic light emitting device that may prevent loss of light emitted from an emission layer.

Additional features of the invention will be set forth in the description which follows, and in part will be apparent from the description, or may be learned by practice of the invention.

The present invention discloses an organic light emitting device including a substrate, an insulating layer disposed on the substrate, a first electrode disposed on the insulating layer, an organic light emitting member disposed on the first electrode, and a second electrode disposed on the organic light emitting member. The insulating layer includes a furrow corresponding to at least one edge of the first electrode, and at least a portion of the second electrode is disposed in the furrow.

The present invention also discloses a method of manufacturing an organic light emitting device including depositing an insulating layer on a substrate, forming a furrow in the insulating layer, forming a first electrode on an inner surface of the furrow and the insulating layer, forming an organic light emitting member on the first electrode, and forming a second electrode on the organic light emitting member, wherein at least portion of the second electrode is disposed in the furrow.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Now, an organic light emitting device according to an exemplary embodiment of the present invention will be described with reference to FIG. 1.

Figure 1:
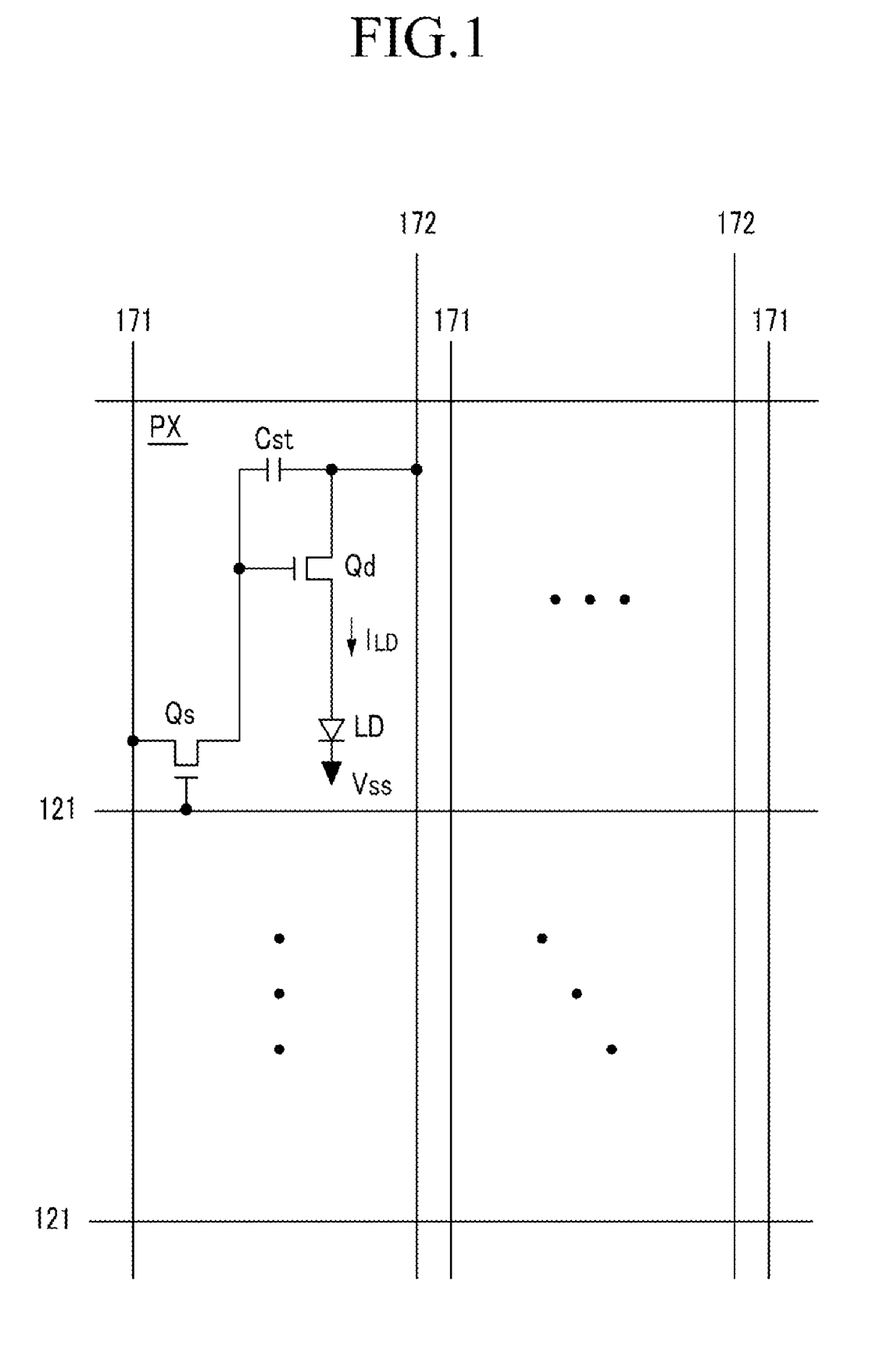
FIG. 1 is an equivalent circuit diagram of an organic light emitting device according to an exemplary embodiment of the present invention.

FIG. 1 is an equivalent circuit diagram of an organic light emitting device according to an exemplary embodiment of the present invention.

Referring to FIG. 1, an organic light emitting device according to the present exemplary embodiment includes a plurality of signal lines 121, 171, and 172, and a plurality of pixels PX connected thereto. The pixels PX are arranged substantially in a matrix.

The signal lines include a plurality of gate lines 121 to transmit gate signals (or scanning signals), a plurality of data lines 171 to transmit data signals, and a plurality of driving voltage lines 172 to transmit a driving voltage. The gate signal lines 121 extend substantially in a row direction and are substantially parallel to each other, and the data lines 171 and the driving voltage lines 172 extend substantially in a column direction and are substantially parallel to each other.

Each pixel PX includes a switching transistor Qs, a driving transistor Qd, a capacitor Cst, and an organic light emitting element. The organic light emitting element functions as an organic light emitting diode (OLED) LD.

The switching transistor Qs has a control terminal connected to one of the gate lines 121, an input terminal connected to one of the data lines 171, and an output terminal connected to the driving transistor Qd. The switching transistor Qs transmits data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element. The driving transistor Qd drives an output current $I_{LD}$ having a magnitude depending on the voltage between the control terminal and the input terminal thereof.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting element has an anode connected to the output terminal of the driving transistor Qd and a cathode connected to a common voltage Vss. The organic light emitting diode LD emits light having an intensity depending on an output current $I_{LD}$ of the driving transistor Qd, thereby displaying images.

The switching transistor Qs and the driving transistor Qd are n-channel field effect transistors (FETs). However, at least one of the switching transistor Qs and the driving transistor Qd may be a p-channel FET or a thin film transistor using amorphous silicon as the semiconductor. In addition, the connections among the transistors Qs and Qd, the capacitor Cst, and the organic light emitting diode LD may be modified.

Figure 2:
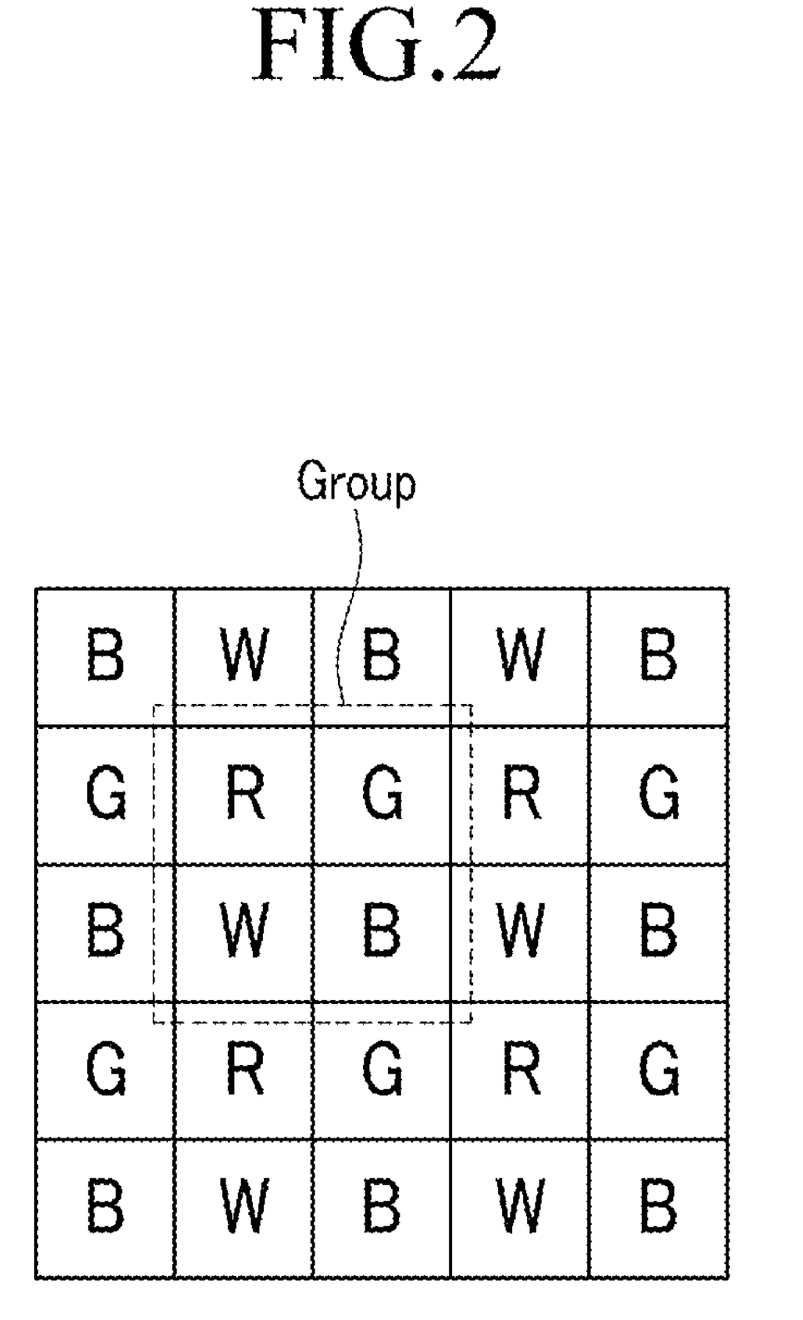
FIG. 2 is a schematic diagram showing an arrangement of a plurality of pixels in the organic light emitting device according to an exemplary embodiment of the present invention.

FIG. 2 is a schematic diagram showing an arrangement of the pixels in an organic light emitting device according to an exemplary embodiment of the present invention. Referring to FIG. 2, the organic light emitting device according to an exemplary embodiment of the present invention includes red pixels R to display a red color, green pixels G to display a green color, blue pixels B to display a blue color, and white pixels W to display a white color, which are sequentially and alternately disposed. Four pixels including a red pixel R, a green pixel G, a blue pixel B, and a white pixel W form one group, and may be repeatedly arranged according to rows and/or columns. However, the arrangement and the shape of the pixels may vary. The red pixels R, the green pixels G, and the blue pixels B are basic pixels to display full colors, and the white pixels W are included to improve the luminance. However, the white pixels W may be omitted.

Next, the detailed structure of the organic light emitting device shown in FIG. 1 and FIG. 2 will be described with reference to FIG. 3, FIG. 4, and FIG. 5.

Figure 3:
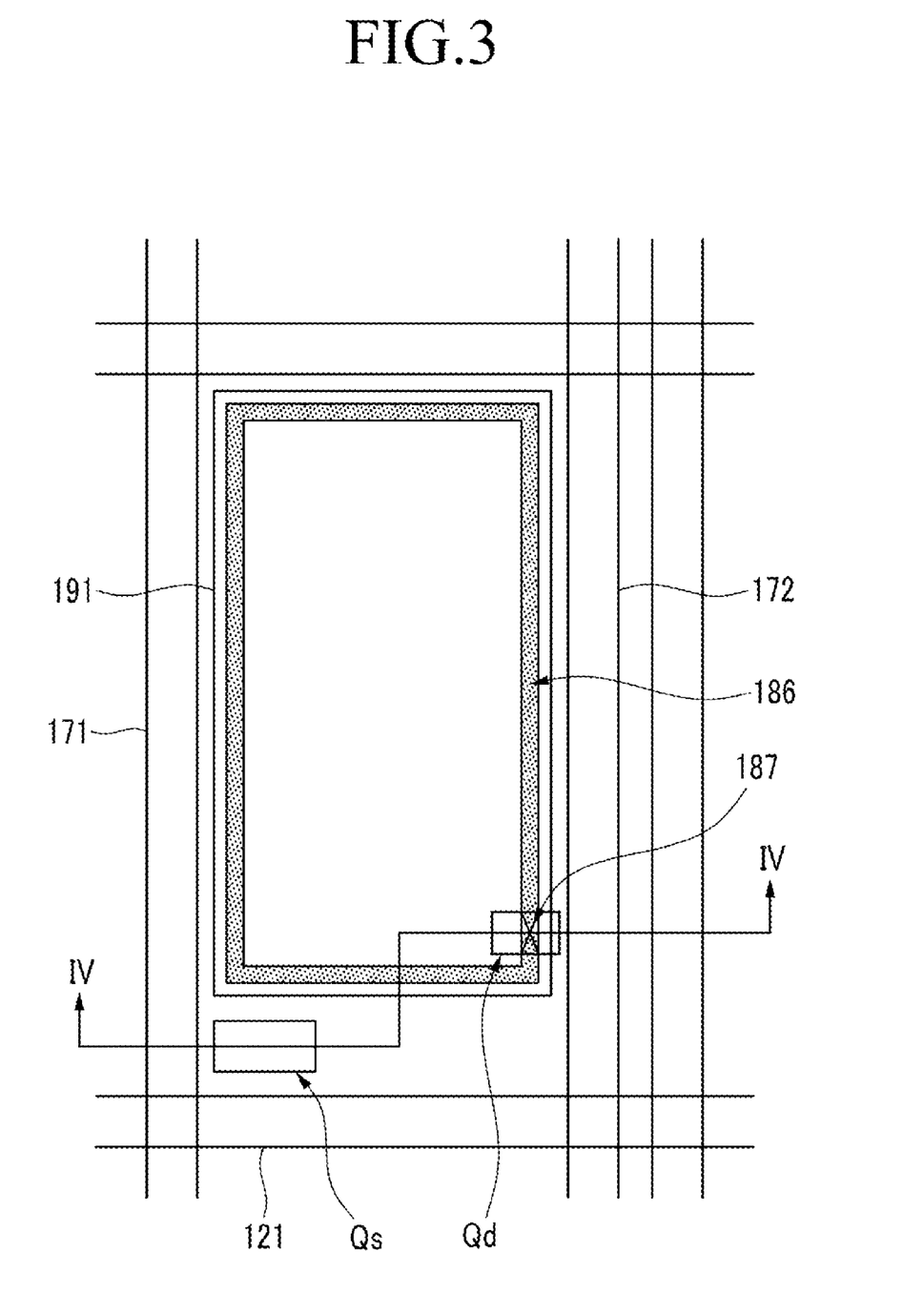
FIG. 3 is a layout view of an organic light emitting device according to an exemplary embodiment of the present invention.
Figure 4:
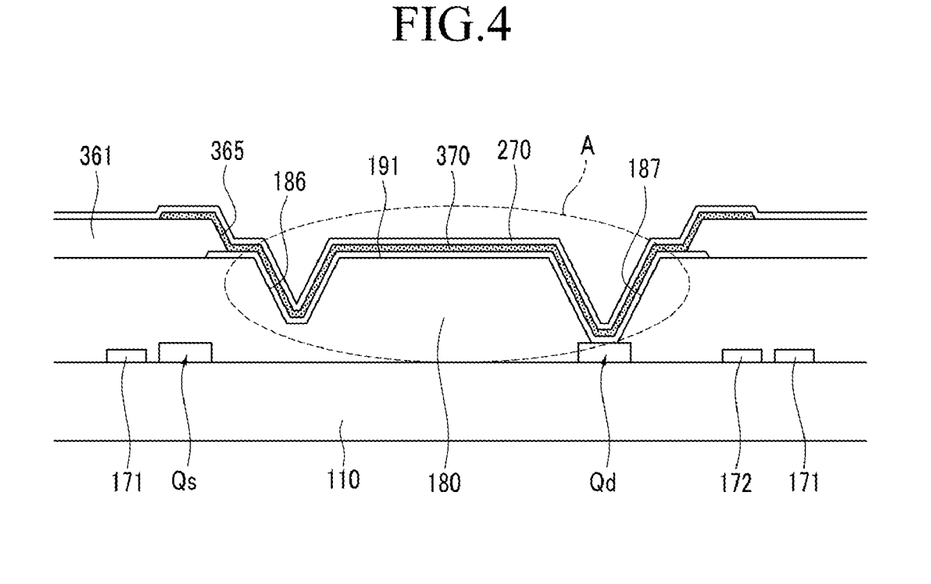
FIG. 4 is a cross-sectional view of the organic light emitting device shown in FIG. 3 taken along line IV-IV.
Figure 5:
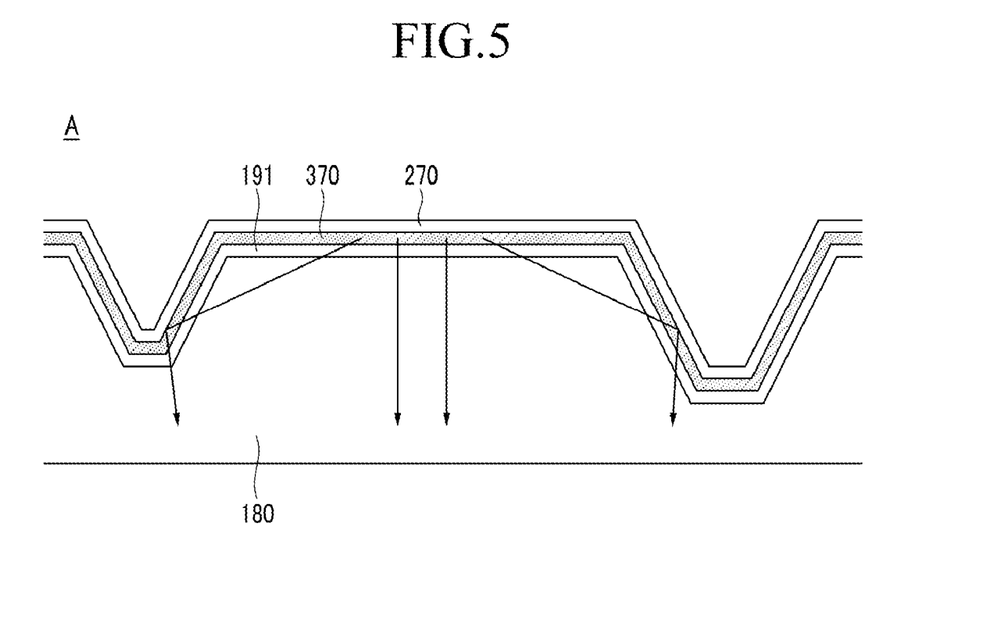
FIG. 5 is an enlarged view of portion "A" in FIG. 4.

FIG. 3 is a layout view of an organic light emitting device according to an exemplary embodiment of the present invention, FIG. 4 is a cross-sectional view of the organic light emitting device shown in FIG. 3 taken along line IV-IV, and FIG. 5 is an enlarged view of portion "A" shown in FIG. 4.

Referring to FIG. 3 and FIG. 4, a plurality of gate lines 121, data lines 171, and driving voltage lines 172 and a plurality of thin film transistor arrays are arranged on an insulating substrate 110. The thin film transistor arrays include switching thin film transistors Qs and driving thin film transistors Qd that are disposed in and electrically connected to each pixel.

A first insulating layer 180 is formed on the thin film transistor array. The first insulating layer 180 may be made of an inorganic insulator or an organic insulator, and may have a flat surface.

A furrow 186 corresponding to the circumference of each pixel is formed in the first insulating layer 180. The furrow 186 may include a through portion 187 that passes through the first insulating layer 180. The through portion 187 of the furrow 186 exposes a portion of the driving thin film transistor Qd, and may be deeper than other portions of the furrow 186. Alternatively, the depth of the furrow 186 may be uniform. That is, the through portion 187 of the furrow 186 may have the same depth as that of the remaining portions of the furrow 186. On the other hand, the furrow 186 of the present exemplary embodiment is continuous along four edges of a pixel electrode 191, but the furrow 186 may correspond to only one, two, or three edges of the pixel electrode 191.

The pixel electrode 191 is formed on the first insulating layer 180. A pixel electrode 191 is disposed in each pixel, and portions of the pixel electrode 191 near the edges thereof are disposed in the furrow 186. One portion of the pixel electrode 191 is connected to the driving thin film transistor Qd through the through portion 187 of the furrow 186. The pixel electrode 191 may be made of a transparent conductive material such as ITO or IZO.

A second insulating layer 361 is formed on the first insulating layer 180. The second insulating layer 361 defines an opening 365 enclosing the edge of the pixel electrode 191, and may be made of an organic insulator or an inorganic insulator. The second insulating layer 361 may be made of a photosensitive material including black pigments, and in this case, the second insulating layer 361 may function as a light blocking member.

An organic light emitting member 370 is formed on the pixel electrode 191 exposed through the opening 365. The organic light emitting member 370 may be a light emission layer and may have a multi-layered structure including an auxiliary layer (not shown) to improve light emitting efficiency of a light emission layer as well as the light emission layer to emit light. The emission layer may include an organic material to uniquely emit light of one color among primary colors, such as red, green, or blue light, or may be a mixture of the organic material and an inorganic material. The organic light emitting device spatially mixes the light having primary colors emitted from the emission layer so as to display desired images. The organic light emitting device may include an emission layer to emit a white color to improve the luminance.

An electron transport layer (not shown) and a hole transport layer (not shown) to balance electrons and holes may be included in the auxiliary layer. Furthermore, an electron injection layer (not shown) and a hole injection layer (not shown) to enhance the injection of electrons and holes, or the like, may also be included in the auxiliary layer.

A common electrode 270 is formed on the organic light emitting member 370 and the second insulating layer 361.

The common electrode 270 may be made of a reflective metal such as aluminum (Al), calcium (Ca), barium (Ba), magnesium (Mg), and silver (Ag). The common electrode 270 is positioned in the furrow 186 disposed in each pixel.

The pixel electrode 191, the organic light emitting member 370, and the common electrode 270 form the organic light emitting element having the pixel electrode 191 as an anode and the common electrode 270 as a cathode, or vice versa.

An encapsulation layer (not shown) may be formed on the common electrode 270. The encapsulation layer encapsulates the organic light emitting member 370 and common electrode 270 to prevent moisture penetration and/or oxidization.

Referring to FIG. 5, the light generated from the organic light emitting member 370 travels toward the substrate 110 to display the images, and the light emitted to the side of the organic light emitting member 370 is reflected by the common electrode 270 disposed in the furrow 186 and guided toward the substrate 110. That is, in the structure according to the present exemplary embodiment, most of the light generated in the organic light emitting member 370 is emitted toward the substrate 110 and used to display the images. Accordingly, the light efficiency of the organic light emitting device may be increased.

Next, an organic light emitting device and a manufacturing method thereof according to another exemplary embodiment of the present invention will be described with reference to FIG. 6 and FIG. 7.

Figure 6:
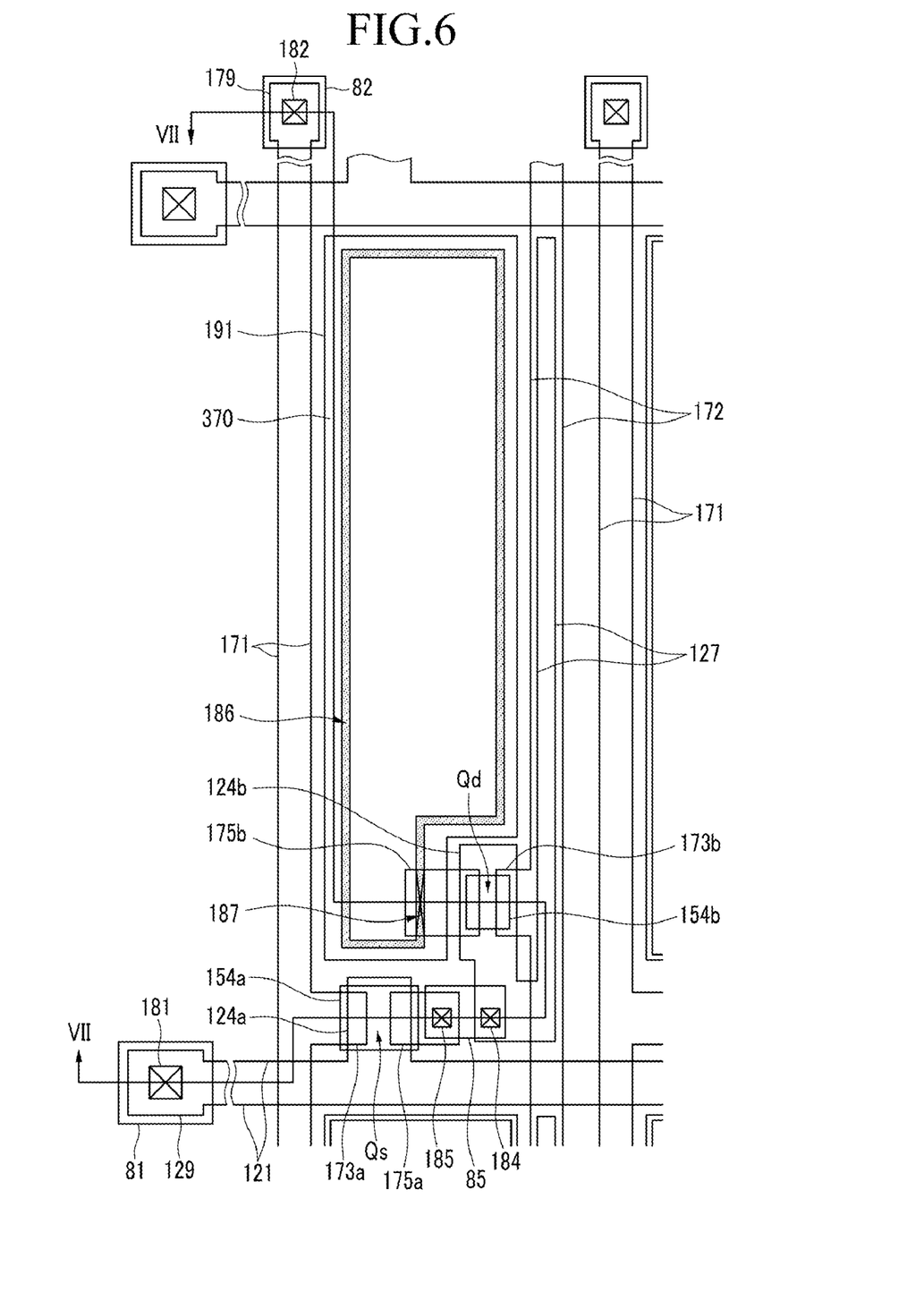
FIG. 6 is a layout view of an organic light emitting device according to another exemplary embodiment of the present invention.
Figure 7:
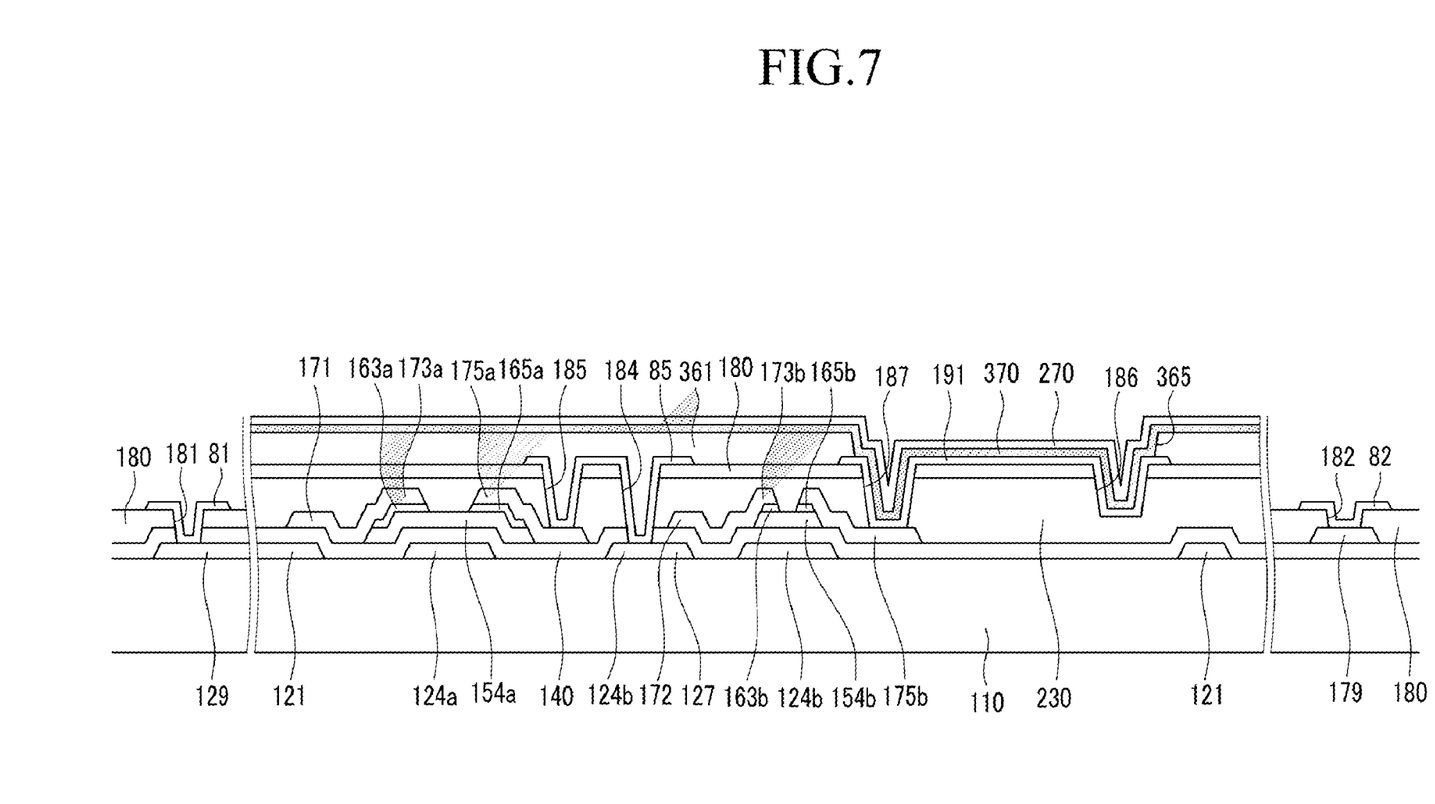
FIG. 7 is a cross-sectional view of the organic light emitting device shown in FIG. 6 taken along line VII-VII.

FIG. 6 is a layout view of an organic light emitting device according to another exemplary embodiment of the present invention, and FIG. 7 is a cross-sectional view of the organic light emitting device shown in FIG. 6 taken along line VII-VII.

A gate conductor including a plurality of gate lines 121 including a plurality of first control electrodes 124a and a plurality of second control electrodes 124b is formed on an insulating substrate 110.

The gate lines 121 transmit gate signals and extend substantially in the transverse direction. Each gate line 121 includes an end portion 129 having a large area to contact another layer or an external driving circuit, and the first control electrodes 124a extend upward from the gate lines 121. The second control electrodes 124b are spaced apart from the gate lines 121 and include a plurality of storage electrodes 127 extending in one direction.

A gate insulating layer 140, which may be made of silicon nitride ($SiN_x$) or silicon oxide ($SiO_2$), is formed on the gate conductors 121, 124a, 124b, and 127.

A plurality of first semiconductors 154a and a plurality of second semiconductors 154b, which may be made of hydrogenated amorphous silicon (a-Si) or polysilicon, are formed on the gate insulating layer 140. The first semiconductors 154a overlap the first control electrodes 124a and the second semiconductors 154b overlap the second control electrodes 124b.

A plurality of pairs of first ohmic contacts 163a and 165a and a plurality of pairs of second ohmic contacts 163b and 165b are respectively formed on the first and second semiconductors 154a and 154b. The first ohmic contacts 163a and 165a are disposed in pairs on the first semiconductors 154a, and the second ohmic contacts 163b and 165b are disposed in pairs on the second semiconductors 154b.

A data conductor including a plurality of data lines 171, a plurality of driving voltage lines 172, and a plurality of first and second output electrodes 175a and 175b is formed on the ohmic contacts 163a, 163b, 165a, and 165b and the gate insulating layer 140.

The data lines 171 transmit data signals and extend in a longitudinal direction while crossing the gate lines 121. Each data line 171 includes a plurality of first input electrodes 173a extending toward the first control electrodes 124a and an end portion 179 having a large area to contact another layer or an external driving circuit.

The driving voltage lines 172 transmit driving voltages and extend in the longitudinal direction while crossing the gate lines 121. Each driving voltage line 172 includes a plurality of second input electrodes 173b extending toward the second control electrodes 124b, and a portion overlapping the storage electrodes 127.

The first and second output electrodes 175a and 175b are spaced apart from each other, and are spaced apart from the data lines 171 and the driving voltage lines 172. The first input electrodes 173a and the first output electrodes 175a are opposite to each other with respect to the first control electrodes 124a, and the second input electrodes 173b and the second output electrodes 175b are opposite to each other with respect to the second control electrodes 124b.

The data conductors 171, 172, 175a, and 175b may be made of a refractory metal such as molybdenum, chromium, tantalum, titanium, or alloys thereof.

The ohmic contacts 163a, 163b, 165a, and 165b are disposed between the semiconductors 154a and 154b thereunder and the data conductors 171, 172, 175a, and 175b, which may reduce contact resistance therebetween. The semiconductors 154a and 154b include a portion between the input electrodes 173a and 173b and the output electrodes 175a and 175b, and the exposed portions by the data conductors 171, 172, 175a, and 175b.

The control electrodes 124a and 124b may be disposed on the semiconductors 154a and 154b, and the gate insulating layer 140 is also disposed between the semiconductors 154a and 154b, and the control electrodes 124a and 124b, in this case. Here, the data conductors 171, 172, 173b, and 175b may be disposed on the gate insulating layer 140, and they may be electrically connected to the semiconductors 154a and 154b through contact holes (not shown) formed in the gate insulating layer 140. Alternatively, the data conductors 171, 172, 173b, and 175b may be disposed under the semiconductors 154a and 154b such that they electrically contact the overlaying semiconductors 154a and 154b.

A color filter 230 is formed on the data conductor 171, 172, 175a, and 175b and the exposed semiconductors 154a and 154b. The color filter 230 may be made of a photosensitive organic material including pigments, and may display a primary color such as red, green, or blue.

The first insulating layer 180 is formed on the color filter 230. The first insulating layer 180 prevents the color filter 230 from lifting and may be made of an inorganic insulator such as silicon nitride or silicon oxide.

The first insulating layer 180 and the color filter 230 have a plurality of contact holes 185 to expose the first output electrodes 175a, and the first insulating layer 180, the color filter 230, and the gate insulating layer 140 have a plurality of contact holes 184 to expose the second control electrodes 124b. The first insulating layer 180 has a plurality of contact holes 182 to expose the end portions 179 of the data lines 171, and the first insulating layer 180 and the gate insulating layer 140 have a plurality of contact holes 181 to expose the end portions 129 of the gate lines 121.

The first insulating layer 180 and the color filter 230 include a furrow 186 that is formed to correspond to the circumference of each pixel. The furrow 186 includes a through portion 187 passing through the first insulating layer 180 and the color filter 230. The through portion 187 of the furrow 186 exposes the portion of the driving thin film transistor Qd and may be deeper than the remaining portion of the furrow 186. Alternatively, the depth of the furrow 186 may be uniform. That is, the through portion 187 of the furrow 186 may have substantially the same depth as the remaining portion of the furrow 186. The furrow 186 including the through portion 187 may be made through half-tone exposure, and the depth thereof may vary according to the design.

A plurality of pixel electrodes 191, a plurality of connecting members 85, and a plurality of contact assistants 81 and 82 are formed on the first insulating layer 180. They may be made of a transparent conductive material such as ITO or IZO.

A pixel electrode 191 is disposed in each pixel, and a portion of the pixel electrode 191 near an edge thereof is disposed in the furrow 186. Another portion of each pixel electrode 191 is connected to the second output electrode 175b through the through portion 187 of the furrow 186.

The connecting members 85 are connected to the second control electrodes 124b and the first output electrodes 175a through the contact holes 184 and 185.

The contact assistants 81 and 82 are respectively connected to the end portions 129 and 179 of the gate lines 121 and the data lines 171 through the contact holes 181 and 182. The contact assistants 81 and 82 enhance the adhesion between the end portions 129 and 179 of the gate lines 121 and data lines 171, and external devices, and protect them.

The second insulating layer 361 is formed on the first insulating layer 180. The second insulating layer 361 defines a plurality of openings 365 enclosing edges of the pixel electrodes 191, and is made of an organic insulator or an inorganic insulator. The second insulating layer 361 may be made of a photosensitive material including black pigments.

A plurality of organic light emitting members 370 is formed on the second insulating layer 361 and the pixel electrodes 191. The organic light emitting member 370 may be an emission layer, and may have a multi-layered structure including the emitting layer and an auxiliary layer to improve the efficiency of light emission of the emitting layer.

The emission layer may include a plurality of sequentially deposited sub-emission layers of materials emitting red, green, and blue light, and may emit white light by combining their light wavelengths. Herein, the present invention is not limited to vertically forming the sub-emission layers, as the sub-emission layers may be horizontally formed. Also, the combination of light to emit the white light is not limited to red, green, and blue light. The sub-emission layers may be formed with various color combinations that emit the white light. The emission layer may have a plurality of sub-emission layers that are repeatedly deposited. For example, a red sub-emission layer, a blue sub-emission layer, and a green sub-emission layer are sequentially deposited, and then the red sub-emission layer, the blue sub-emission layer, and the green sub-emission layer may be repeatedly deposited.

The auxiliary layer may include at least one selected from an electron transport layer (not shown) and a hole transport layer (not shown), and an electron injecting layer (not shown) and a hole injecting layer (not shown).

A common electrode 270 is formed on the organic light emitting member 370. The common electrode 270 may be made of a reflective metal such as aluminum (Al), calcium (Ca), barium (Ba), silver (Ag), or magnesium (Mg). The common electrode 270 is disposed in the furrow 186 disposed in each pixel.

In the above-described organic light emitting device, the switching control electrode 124a electrically connected to the gate line 121, the switching input electrode 173a electrically connected to the data line 171, and the switching output electrode 175a form the switching thin film transistor Qs along with the switching semiconductor 154a, and the channel of the switching thin film transistor Qs is formed in the switching semiconductor 154a between the switching input electrode 173a and the switching output electrode 175a. The driving control electrode 124b electrically connected to the switching output electrode 175a, the driving input electrode 173b electrically connected to the driving voltage line 172, the driving output electrode 175b connected to the pixel electrode 191, and the driving semiconductor 154b form the driving thin film transistor Qd, and the channel of the driving thin film transistor Qd is formed in the driving semiconductor 154b between the driving input electrode 173b and the driving output electrode 175b.

The pixel electrode 191, the organic light emitting member 370, and the common electrode 270 form the organic light emitting element, and the storage electrode 127 and the driving voltage line 172 that overlap each other form the storage capacitor Cst.

According to this structure, the light emitted from the organic light emitting member 370 travels toward the substrate 110 to display the images, and the light emitted from the side of the organic light emitting member 370 is reflected by the common electrode 270 disposed in the furrow 186 and travels toward the substrate 110. Accordingly, most of the light generated from the organic light emitting member 370 is emitted toward substrate 110 and is used to display the images.

Next, a manufacturing method of the organic light emitting device will be described in detail.

A gate conductor including a plurality of gate lines 121, a plurality of first and second control electrodes 124a and 124b, and a plurality of storage electrodes 127, a gate insulating layer 140, a plurality of first and second semiconductors 154a and 154b, a plurality of first and second ohmic contacts 163a, 165a, 163b, and 165b, a data conductor including a plurality of data lines 171, a plurality of driving voltage lines 172, and a plurality of first and second output electrodes 175a and 175b, a color filter 230, and the first insulating layer 180 are sequentially formed on the substrate 110.

Next, the first insulating layer 180 and the color filter 230 are patterned by photolithography to form a furrow 186 including a through portion 187 and a plurality of contact holes 184 and 185. Here, the furrow 186 may be formed along with the through portion 187 and the contact holes 184 and 185 using a halftone exposure using a mask having slits or a translucent layer. For example, when a positive photosensitive film is coated on the first insulating layer 180, and the furrow 186, the through portion 187, and the contact holes 184 and 185 are formed through the halftone exposure, the region corresponding to the through portion 187 is disposed on the transparent portion of the mask, the region corresponding to the furrow 186 is disposed on the semi-transparent portion of the mask, and the region without the furrow 186 is disposed on the opaque portion of the mask under the halftone exposure.

Next, a pixel electrode 191 is formed on the inner surface of the furrow 186 and the first insulating layer 180. When forming the pixel electrode 191, a connecting member 85 and contact assistants 81 and 82 are also formed. Next, a second insulating layer 361 including an opening 365 to expose the pixel electrode 191 is formed on the first insulating layer. An organic light emitting member 370 and a common electrode 270 are the sequentially formed on the pixel electrode 191 and the second insulating layer 361. Here, at least a portion of the organic light emitting member 370 and the common electrode 270 is positioned in the furrow 186.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device, comprising:
    a substrate;
    an insulating layer disposed on the substrate;
    a first electrode disposed on the insulating layer;
    an organic light emitting member disposed on the first electrode; and
    a second electrode disposed on the organic light emitting member,
    wherein the insulating layer comprises a furrow corresponding to entire edges of the first electrode, and at least a portion of the second electrode is disposed in the furrow.

2. The organic light emitting device of claim 1, further comprising:
    a thin film transistor disposed between the insulating layer and the substrate,
    wherein the furrow includes a through portion passing through the insulating layer and exposing the thin film transistor, and the first electrode is connected to the thin film transistor through the through portion.

3. The organic light emitting device of claim 2, wherein:
    the through portion of the furrow is deeper than the remaining portion of the furrow.

4. The organic light emitting device of claim 3, wherein:
    the furrow corresponds to the edge of the first electrode.

5. The organic light emitting device of claim 1, wherein:
    the second electrode comprises a reflective metal.

6. The organic light emitting device of claim 5, wherein:
    the organic light emitting member comprises an emission layer.

7. The organic light emitting device of claim 6, wherein:
    the emission layer comprises a plurality of sub-emission layers to emit light having different wavelengths, and
    the sum of the light of the different wavelengths forms a white light.

8. The organic light emitting device of claim 7, further comprising:
    a color filter disposed between the substrate and the insulating layer.

9. The organic light emitting device of claim 6, wherein:
    the emission layer emits red light, green light, blue light, or white light.

10. An organic light emitting device, comprising:
    a substrate;
    a color filter disposed on the substrate;
    an insulating layer disposed on the color filter;
    a first electrode disposed on the insulating layer;
    an organic light emitting member disposed on the first electrode; and
    a second electrode disposed on the organic light emitting member,
    wherein the insulating layer and the color filter comprise a furrow corresponding to the entire perimeter of the first electrode, and at least a portion of the second electrode is disposed in the furrow.

11. The organic light emitting device of claim 10, further comprising:
    a thin film transistor disposed between the color filter and the substrate,
    wherein the furrow includes a through portion passing through the insulating layer and the color filter and exposing the thin film transistor, and the first electrode is connected to the thin film transistor through the through portion.

12. The organic light emitting device of claim 11, wherein:
    the through portion of the furrow is deeper than the remaining portion of the furrow.

13. The organic light emitting device of claim 10, wherein:
    the second electrode comprises a reflective metal.

* * * * *